United States Patent [19]
Chang et al.

[11] Patent Number: 5,467,308
[45] Date of Patent: Nov. 14, 1995

[54] CROSS-POINT EEPROM MEMORY ARRAY

[75] Inventors: Kuo-Tung Chang; Ko-Min Chang, both of Austin, Tex.

[73] Assignee: Motorola Inc., Schaumburg, Ill.

[21] Appl. No.: 223,354

[22] Filed: Apr. 5, 1994

[51] Int. Cl.[6] .................................................. G11C 11/40
[52] U.S. Cl. ...................... 365/185.01; 365/63; 365/218; 257/314; 257/316
[58] Field of Search .............................. 365/185, 63, 218, 365/900; 257/316, 314, 315

[56] References Cited

U.S. PATENT DOCUMENTS

| | | | |
|---|---|---|---|
| 5,020,030 | 5/1991 | Huber | 365/185 |
| 5,051,793 | 9/1991 | Wang | 357/23.5 |
| 5,063,172 | 11/1991 | Manley | 437/43 |
| 5,231,299 | 7/1993 | Ning et al. | 257/316 |
| 5,241,193 | 8/1993 | Pfiester et al. | 257/316 X |
| 5,280,446 | 1/1994 | Ma et al. | 365/185 |

OTHER PUBLICATIONS

T. Y. Chan et al., "A True Single–Transistor Oxide–Nitride–Oxide EEProm Device", IEEE EDL-8, No. 3, Mar. 1987, pp. 93–95.
Yoshimitau Yamauchi, et al., "A 5V–only Virtual Ground Flash Cell with an Auxiliary Gate for High Density and High Speed Application", IEDM 1991, pp. 319–322.
K. Naruke, et al., "A New Flash–Erase EEPROM Cell with a Sidewall Select–Gate on its Source Side", IEDM 1989, pp. 603–606.
A. T. Wu, "A Novel High–Speed, 5–Volt Programming Eprom Structure", 1986 IEEE, pp. 584–587.

*Primary Examiner*—Do Hyun Yoo
*Attorney, Agent, or Firm*—Jasper W. Dockrey

[57] ABSTRACT

A cross-point EEPROM memory array includes a semiconductor substrate (10) having first and second bit-lines (32, 34) spaced apart by a channel region (36). A control gate electrode (24) is formed by a portion of a control gate line, which overlies a first portion of the channel region (36) and is separated therefrom by an ONO layer (17). A select gate electrode (40) is formed by a portion of a select gate line disposed on the substrate (10) perpendicular to the control gate line. Individual cells in the array are programmed by injecting electrons using source-side injection into trapping sites (19) in the silicon nitride layer (14) of the ONO layer (17). The cells in the array are erased by electron tunneling through the top silicon dioxide layer (16) of the ONO layer (17), and are dissipated in the control gate electrode (24). Improved operating performance is obtained, in part, by fabricating the first silicon dioxide layer (12) of the ONO layer (17) to a greater thickness than the top silicon dioxide layer (16) of the ONO layer (17).

9 Claims, 4 Drawing Sheets

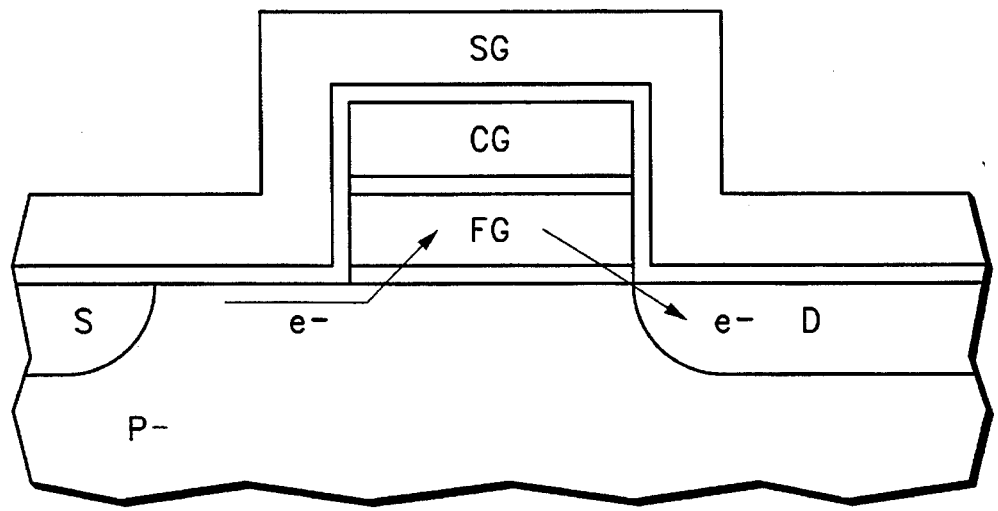
FIG.1
—PRIOR ART—
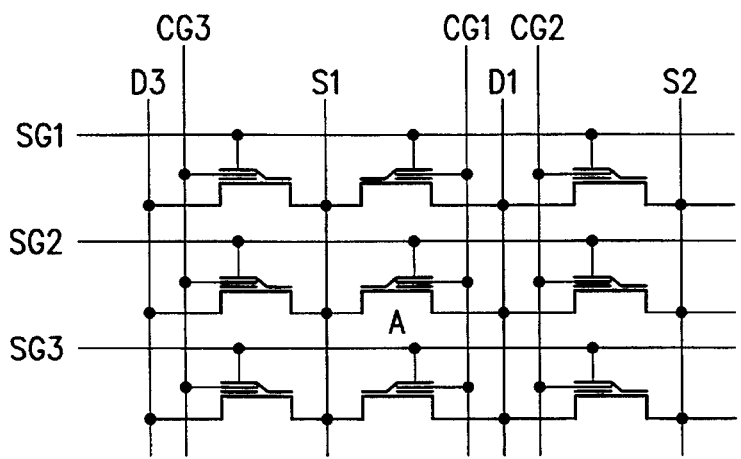
FIG.2
—PRIOR ART—
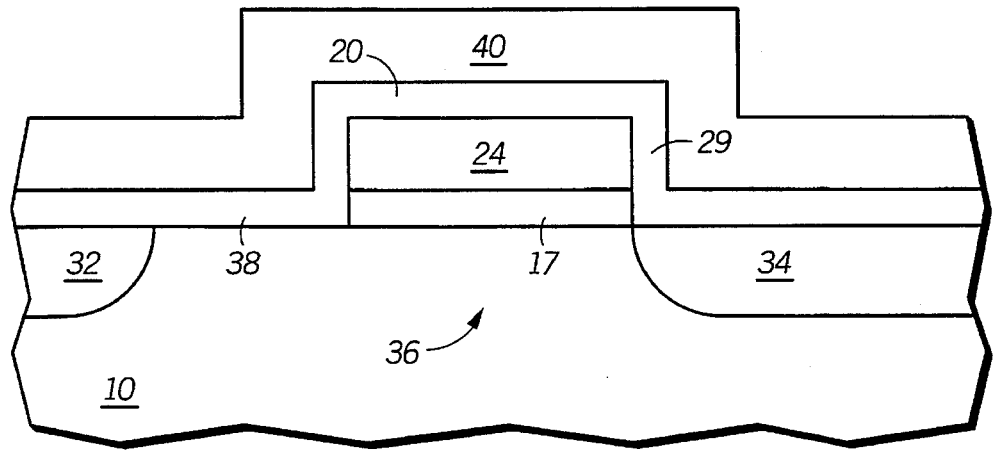
FIG.3-a

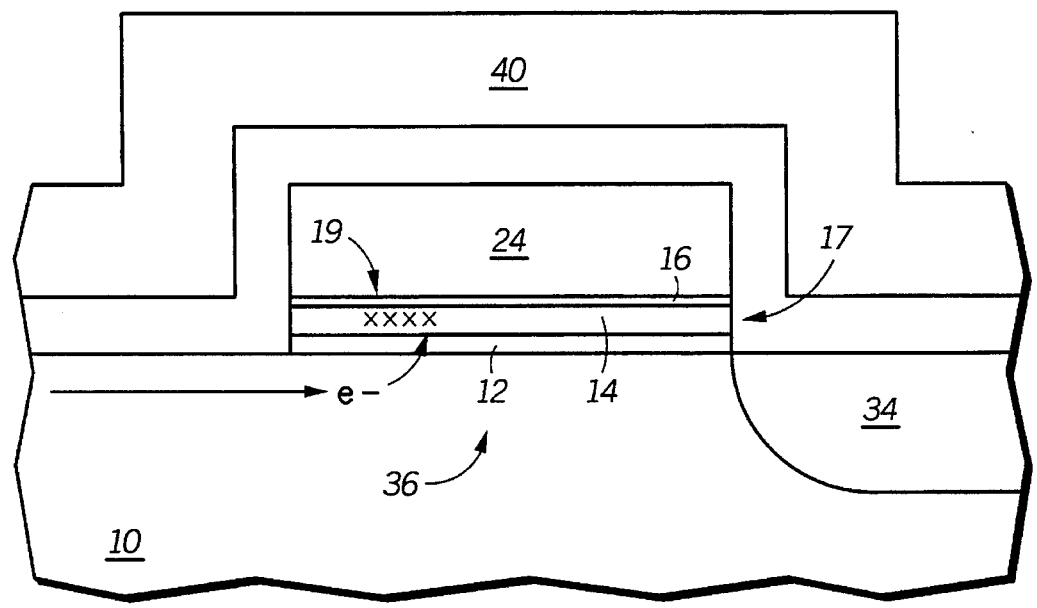
*FIG.3-b*
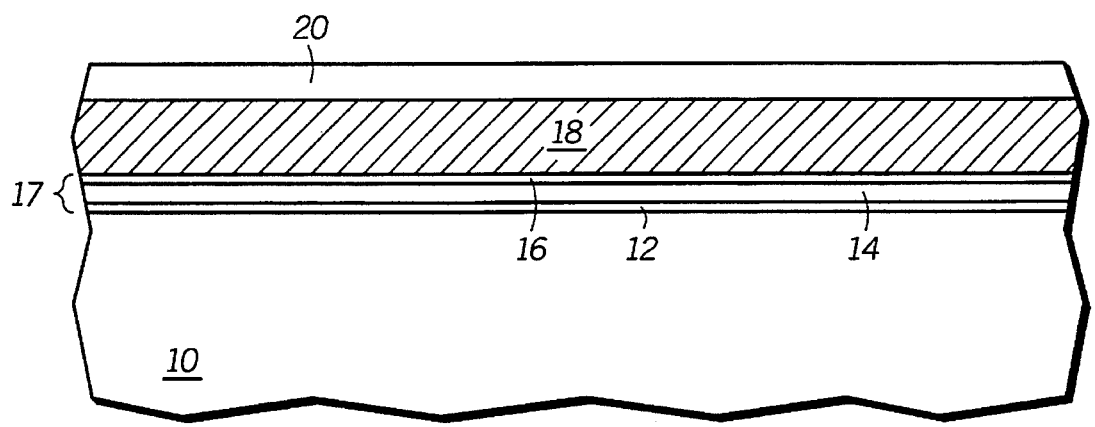
*FIG.4*
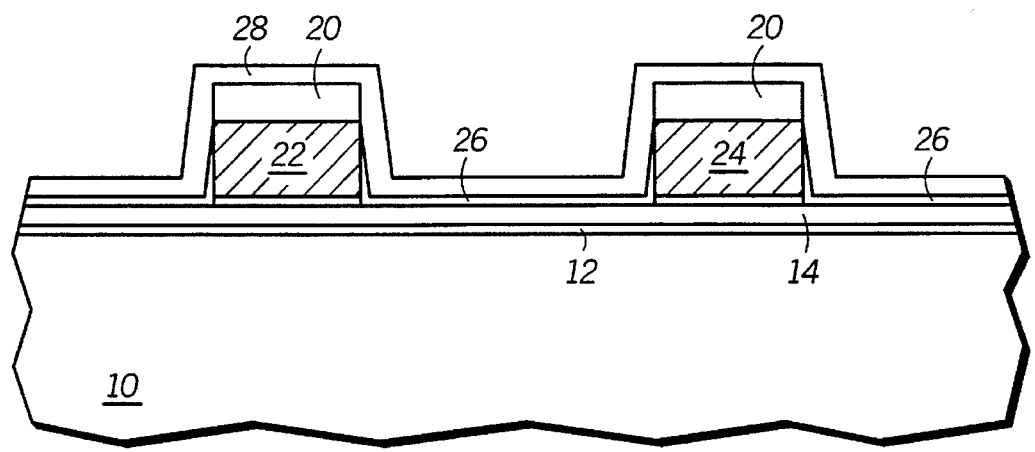
*FIG.5*

CROSS-POINT EEPROM MEMORY ARRAY

FIELD OF THE INVENTION

This invention relates in general to EEPROM memory arrays, and more particularly, to memory arrays having a cross-point architecture and which can be operated by a single, low-voltage power supply.

BACKGROUND OF THE INVENTION

Typically, an EEPROM (electrically-erasable-read-only-memory) device includes a polysilicon, floating gate electrode upon which electrical charge is stored. The floating gate electrode overlies a channel region residing between source and drain regions in a semiconductor substrate. The floating gate electrode together with the source, drain and channel regions forms an enhancement transistor. By storing electrical charge on the floating gate electrode, the threshold voltage of the enhancement transistor is brought to a high value. Correspondingly, when charge is removed from the floating gate electrode, the threshold voltage of the enhancement transistor is brought to a relatively low value. The threshold voltage level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transfered to the floating gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating gate by an overlying control gate electrode. The control gate electrode is capacitively coupled to the floating gate electrode, such that a voltage applied on the control gate electrode is coupled to the floating gate electrode. The flash EEPROM device is programmed by applying a high positive voltage to the control gate electrode and a lower positive voltage to the drain region, which transfers electrons from the channel region to the floating gate electrode. The flash EEPROM device is erased by grounding the control gate electrode and applying a high positive voltage to either the source or drain region of the enhancement transistor. Under erase voltage conditions, electrons are removed from the floating gate electrode and into either the source or drain regions in the semiconductor substrate.

Individual EEPROM devices are typically arranged in an array, which includes a series of rows and columns. An individual cell resides at the intersection of a row and column and consists of an enhancement transistor and control gate electrode. Advanced EEPROM memory cells also include a select gate electrode overlying a portion of the channel region adjacent to the floating gate electrode. An EEPROM device which includes a select gate electrode and a control gate electrode overlying the channel region of the enhancement transistor is known in the art as a split-gate device. As the demand for increased performance continues, memory designers are increasingly employing split-gate cell designs to improve the read stability of EEPROM arrays. The select gate electrode improves performance by regulating programming current and preventing false "on" conditions during read operations.

One example of a split-gate EEPROM device arranged in accordance with the prior art is illustrated in FIG. 1. The EEPROM device includes an N+ source region S and an N+ drain region D formed in a P− semiconductor substrate and defining a channel region therebetween. A stacked gate structure, which includes a control gate CG overlying a floating gate FG resides over a portion of the channel region adjacent to the drain region D. A select gate SG overlies a portion of the channel region adjacent to the source region and also extends over the stacked gate structure.

The EEPROM device is programmed by injecting electrons onto the floating gate electrode from the source using source-side injection. Additionally, the device is erased by either hole injection, or Fowler-Nordheim tunneling of electrons into the drain region.

An example of a memory array arranged in accordance with the prior art employing an EEPROM device, such as the EEPROM device illustrated in FIG. 1, is shown in the schematic diagram of FIG. 2. The memory array is arranged in a cross-point architecture, where the select gate lines are disposed perpendicular to both the control gate lines and the drain lines. In operation, when data is read from cell A, false "on" signals from the memory cells connected to drain D1 and in the same column as cell A are prevented by grounding select gate lines SG1 and SG3. The select gate electrodes also regulate electrical current in the channel region during programming of the memory cells.

In addition to avoiding false on signals, the cross-point array illustrated in FIG. 2 also avoids gate disturbance conditions in adjacent cells during programming of the selected cell A. Since all of the cells in the same column as cell A of the array share the same control gate line and drain line, all the cells in the column experience the same positive voltage levels as cell A during the programming of cell A. By avoiding a large potential difference in the adjacent cells in the same column as cell A, the electric field generated across the dielectric layer of the adjacent cells is minimized. Also, by maintaining a low electric field in adjacent cells during the programming of cell A, inadvertent programming of the adjacent cells is avoided.

While a cross-point memory cell arranged in accordance with the prior art offers improved performance by stabilizing disturbance conditions in unselected cells during programming, reading, and erasing operations, the EEPROM device and array require three separate layers of polysilicon for the fabrication of the array. In addition to added process complexity, the fabrication of a cross-point array requiring three layers of polysilicon limits the applicability of this array for use as an on-board memory unit in a microprocessor or microcontroller device. Many high performance microprocessors and microcontrollers are designed to be fabricated using only two layers of polysilicon. Accordingly, further development is necessary to provide a cross-point EEPROM array, which fully benefits from the advantages of a split-gate and cross-point architecture.

SUMMARY OF THE INVENTION

In practicing the present invention there is provided a cross-point EEPROM memory array, having control gate electrodes and select gate electrodes fabricated in two separate layers of semiconductor material. Electrical charge is stored in an ONO layer overlying a silicon semiconductor substrate and separating the control gate electrode from the substrate. By programming individual cells in the memory array with source-side electron injection, and erasing individual cells using top oxide electron tunneling, the memory array of the invention can be operated from a single, low-voltage power supply. Additionally, the cross-point architecture of the array reduces electrical disturbance in adjacent memory cells when an individual memory cell is addressed, and information is programmed, erased, or read from the individual cell.

The cross-point memory array includes a semiconductor substrate having first and second bit-lines diffused therein and defining a channel region therebetween. A control gate electrode overlies a first portion of the channel region and is separated therefrom by an ONO layer. A select gate electrode overlies the control gate electrode and a second portion of the channel region. The control gate electrode is spaced apart from the first bit-line by the select gate electrode. The control gate electrode and the select gate electrode are disposed on the semiconductor substrate in a perpendicular relationship. The second diffused bit-line resides in the substrate in a parallel relationship to the control gate electrode.

The ONO layer underlying the control gate electrode includes a relatively thick silicon oxide layer overlying the substrate and separated from a relatively thin silicon oxide layer by a silicon nitride layer. Because the silicon oxide layer overlying the substrate is relatively thick, enhanced data retention is achieved in the memory array of the invention. Additionally, by sharing adjacent bit-lines individual cells in the cross-point array are assembled with a virtual ground architecture, which increases the packing density of the memory cells.

BRIEF DESCRIPTION OF THE DRAWINGS

FIG. 1 illustrates, in cross-section, an EEPROM device in accordance with the prior art;

FIG. 2 is a schematic diagram of a memory array arranged in accordance with the prior art;

FIGS. 3-*a* and 3-*b* illustrate, in cross-section, a portion of an individual memory cell formed in accordance with the invention;

FIGS. 4–7 illustrate, in cross-section, exemplary process steps for the fabrication of a memory cell in accordance with the invention;

Figure 6:
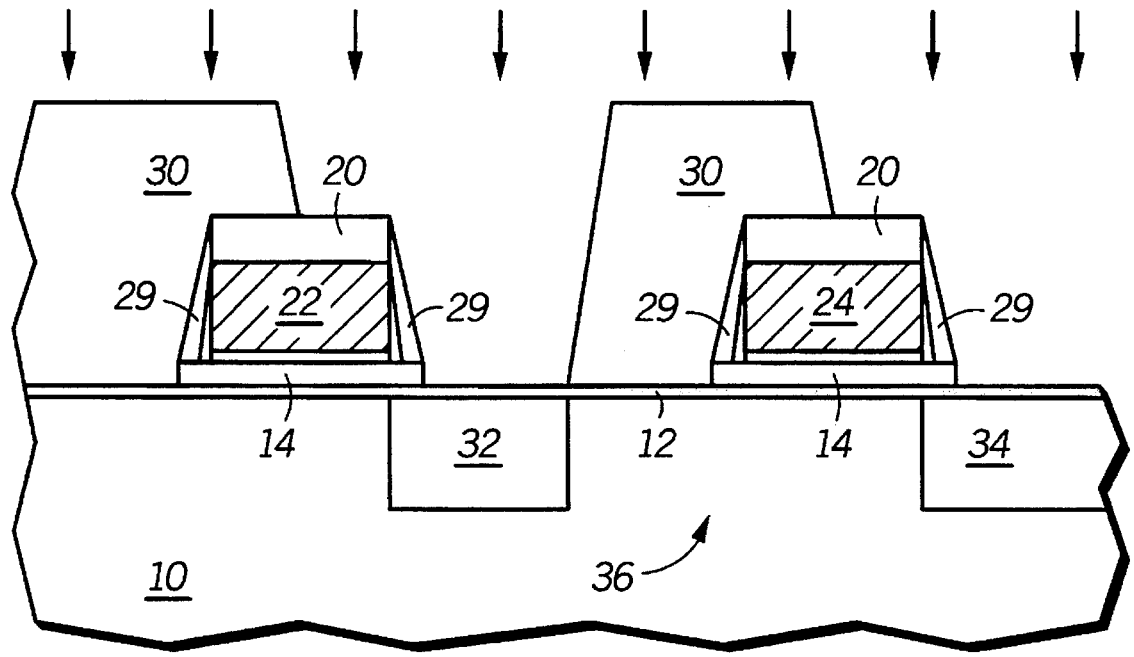

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention is for a cross-point EEPROM memory array in which a plurality of memory cells each having a control gate and a select gate are fabricated in 2 layers of semiconductor material. Each cell of the array stores electrical charge in an ONO layer underlying the control gate electrode. The array is designed such that the control gate electrodes and the bit-lines are disposed on the substrate in a parallel relationship, and the select gate electrodes are disposed perpendicular to the control gate electrodes and the bit-lines. The perpendicular relationship of the control gate electrodes and select gate electrodes together with the storage of charge in an ONO layer improves the immunity of individual cells in the array to disturbance conditions arising from programming and erasing operations and improves the usable lifetime of the array as a memory storage device. Additionally, small cell size is achieved through the use of virtual ground architecture in which all memory cells in adjacent columns of the array share a common bit-line.

In the following description, the EEPROM device illustrated in FIG. 3 will be described in the context of the structure and function of an n-channel EEPROM cell and array. Accordingly, semiconductor substrate 10 is predominantly of p-type conductivity with n-type regions therein forming the source and drain regions. Those skilled in the art will recognize that while this is, by far, the most common choice for EEPROM devices, it is also possible to reverse the conductivity and fabricate a p-channel EEPROM array.

Shown in FIG. 3-*a*, in cross-section, is a portion of one cell in the cross-point EEPROM memory array of the invention. The cell includes a source region 32 and a drain region 34 residing in a semiconductor substrate 10 and defining a channel region 36 therebetween. A control gate electrode 24 overlies a first portion of channel region 36 and is spaced apart from the channel region by an ONO layer 17. A select gate electrode 40 overlies a second portion of channel region 36 adjacent to control gate electrode 24, and also overlies control gate electrode 24 and drain region 34. Select gate electrode 40 is separated from the second portion of channel region 36 by a dielectric layer 38. Additionally, select gate electrode 40 is separated from control gate electrode 24 by a first insulating layer 20, and by a sidewall insulator 29. Although region 32 is described as a source region for purposes of the present discussion, as will be subsequently described, because of the virtual ground architecture of the memory array, both source region 32 and drain region 34 function as first and second bit-lines, respectively, in the memory array.

The source-side injection method of programming the EEPROM device of the present invention is illustrated in FIG. 3-*b*, which illustrates an exploded view of a portion of the device shown in FIG. 3-*a*. During programming, electrons from source region 32 traverse channel region 36, and under an electric field gradient generated in channel region 36, are injected into ONO layer 17. ONO layer 17 is comprised of a first silicon oxide layer 12 overlying a portion of channel region 36. A silicon nitride layer 14 overlies first silicon dioxide layer 12, and a second silicon dioxide layer 16 overlies silicon nitride layer 14.

Electron acceleration energy is created by a potential gradient in channel region 36. The potential gradient is generated by applying positive voltage potentials to control gate 24, drain region 34, and select gate 40. For example, applying 1 to 2 volts to select gate 40 weakly turns on the second portion of channel region 36. With about 10 volts applied to control gate 24 and about 5 volts applied to drain region 34, the first portion of channel region 36, below control gate 24, is strongly turned on. The potential gradient created by the electric fields generated at the interface of the first and second portions of channel region 36 accelerates electrons traveling across channel region 36 from source region 32. The electrons achieve a sufficient acceleration energy to overcome the potential barrier at the interface of substrate 10 and ONO layer 17, and are injected into trapping sites 19 located in silicon nitride layer 14 near the source-side of control gate 24. Of course, in the case of a p-channel device the charge carriers are holes and all applied bias voltages have negative values.

Programming by source-side injection is carried out at a relatively low drain voltage in comparison with drain-side hot carrier injection. The low drain voltage enables EEPROM cells to be programmed by using a single 5-volt power supply. The higher voltage applied to the control gate during programming can be attained by charge pumping circuitry electrically coupled to the 5-volt power supply. Additionally, the programming efficiency is greater with source-side injection than with drain-side injection. Source-side injection rapidly increases the threshold voltage of the channel region below the ONO layer, effectively placing the device in a programmed or logic 0 state within a few microseconds.

The EEPROM cell is erased by applying a high positive voltage to control gate 24, while grounding select gate 40, and source and drain regions 32 and 34. Under the applied voltage potential, Fowler-Nordheim tunneling can take place, and electrons tunnel from ONO layer 17 and are dissipated in control gate 24. Erasing the EEPROM cell by tunneling electrons through the top oxide of the ONO layer improves performance of the device by increasing the write/erase tolerance of the cell by reducing the tendency for dielectric breakdown. Select gate 40 is formed to overlie channel region 36 and control gate 24, such that select gate 40 electrically controls the second portion of channel region 36 between source region 32 and control gate 24. Select gate 40 controls the programming current during a write operation and prevents false "on" conditions when adjacent memory cells located on the same bit-line are read. As will subsequently be described, the fabrication of select gate 40 in a layer of polysilicon overlying substrate 10, and disposed perpendicular to the direction of control gate 24, improves the immunity of individual cells in the EEPROM array to voltage disturbances when adjacent cells are programmed and read.

FIGS. 4–7 illustrate, in cross-section, exemplary process steps for the fabrication of a portion of the cross-point EEPROM array. The process begins as illustrated in FIG. 4, with the formation of ONO layer 17 on the surface of substrate 10. ONO layer 17 includes a first silicon dioxide layer 12 overlying the surface of substrate 10, and a silicon nitride layer 14 overlying first silicon dioxide layer 12. A second silicon dioxide layer 16 overlies the surface of silicon nitride layer 14. Preferably, first silicon dioxide layer 12 is formed by the thermal oxidation of substrate 10. Following the oxidation process, silicon nitride layer 14 is deposited by chemical vapor deposition. After depositing silicon nitride layer 14, second silicon dioxide layer 16 is also formed by a chemical vapor deposition process as a top oxide layer. In a preferred embodiment, first silicon dioxide layer 12 is thermally grown to a thickness of about 100–150 angstroms, and second silicon dioxide layer 16 is preferably deposited to a thickness of about 30–40 angstroms. It is important to note that second silicon dioxide layer 16 as deposited by chemical vapor deposition is a high-quality oxide film and provides a low defect oxide layer for Fowler-Nordheim tunneling of electrons during an erase cycle.

Once ONO layer 17 is formed, a first semiconductor layer 18 is deposited to overlie ONO layer 17. Preferably, first semiconductor layer 18 is polycrystalline silicon deposited by a silane gas chemical vapor deposition process. Alternatively, first semiconductor layer 18 can be a polycrystalline silicon material alloyed with a refractory metal silicide. First semiconductor layer 18 is doped with phosphorus or arsenic to have an n-type conductivity either during deposition of immediately afterward. Next, a first insulating layer 20 is deposited to overlie first semiconductor layer 18. Preferably, first insulating layer 20 is deposited by chemical vapor deposition using tetraethylorthosilane (TEOS) source gas.

After first insulating layer is formed, a photolithographic pattern is defined and a sequential etching process is carried out to form first and second control gate electrodes 22 and 24, respectively, as illustrated in FIG. 5. Preferably, a reactive ion etching process is used to remove unmasked portions of first insulating layer 20 using fluorine based etching gases. After removing exposed portions of first insulating layer 20, chlorinated etching gases are used to anisotropically etch first semiconductor layer 18 to form the control gate electrodes. Exposed portions of second silicon dioxide layer 16 are also etched, such that portions of ONO layer 17 remain underlying the control gate electrodes.

Once control gate electrodes 22 and 24 are defined, a second insulating layer 26 is formed to overlie exposed portions of silicon nitride layer 14 and the sidewalls of control gate electrodes 22 and 24. Preferably, second insulating layer 26 is a thermally grown silicon oxide material. In the method illustrated in FIG. 5, second insulating layer 26 is thermally grown such that the insulating layer overlies only edge portions of control gate electrodes 22 and 24, and a thin layer is formed by thermal oxidation on the surface of silicon nitride layer 14. After forming second insulating layer 26, a third insulating layer 28 is deposited to overlie substrate 10, including first insulating layer 20. Preferably, third insulating layer 28 is silicon nitride deposited by a chemical vapor deposition process.

The exemplary process continues by anisotropically etching third insulating layer 28 and second insulating layer 26 to form a sidewall insulator 29 on the wall surfaces of control gate electrodes 22 and 24, as illustrated in FIG. 6. The anisotropic etching process also removes a portion of silicon nitride layer 14 overlying the surface of substrate 10 at locations removed from the wall surfaces of control gate electrodes 22 and 24. Thus, portions of nitride layer 14 forming ONO layer 17 are self-aligned to control gate electrodes 22 and 24.

Referring to FIG. 6, source and drain regions 32 and 34 are preferably formed by an ion implant process using a photolithographic mask 30 and an edge portion of control gate electrodes 22 and 24 as doping masks. By aligning photolithographic mask 30 to the source-side of control gate electrodes 22 and 24, the ion implant process forms doped regions in substrate 10 aligned to the drain-side of control gate electrodes 22 and 24. Preferably, phosphorous or arsenic atoms are ion implanted into substrate 10 to form source and drain regions 32 and 34. Because the EEPROM array under construction utilizes virtual ground architecture, photolithographic mask 30 defines bit-lines in substrate 10 which are displaced parallel to the control gate lines. Accordingly, although region 32 is referred to as a "source" region, because virtual array architecture is employed, region 32 also functions as a drain region for all the memory cells controlled by control gate 22. As will subsequently become apparent, the use of virtual ground architecture reduces the size of individual cells in the EEPROM memory array by removing the requirement to form a contact for a separate source region in each memory cell.

Figure 7:
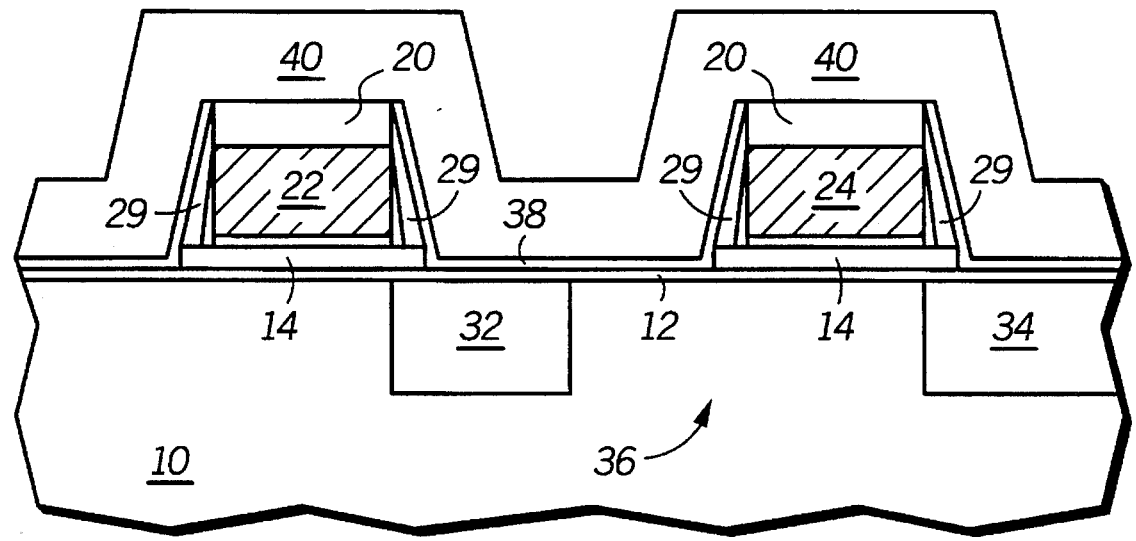

Following bit-line formation, a select gate dielectric layer 38 is thermally grown to overlie exposed portions of first silicon dioxide layer 12, as illustrated in FIG. 7. Next, a second semiconductor layer 40 is deposited by chemical vapor deposition to overlie select gate dielectric layer 38 and control gates 22 and 24. Preferably the second semiconductor layer is polycrystalline silicon, which is doped either during or after chemical vapor deposition with an n-type dopant, such as phosphorous or arsenic. Following deposition, the second semiconductor layer is photolithographically patterned and etched to form select gate lines (also designated as element 40) in the EEPROM memory array.

Figure 8:
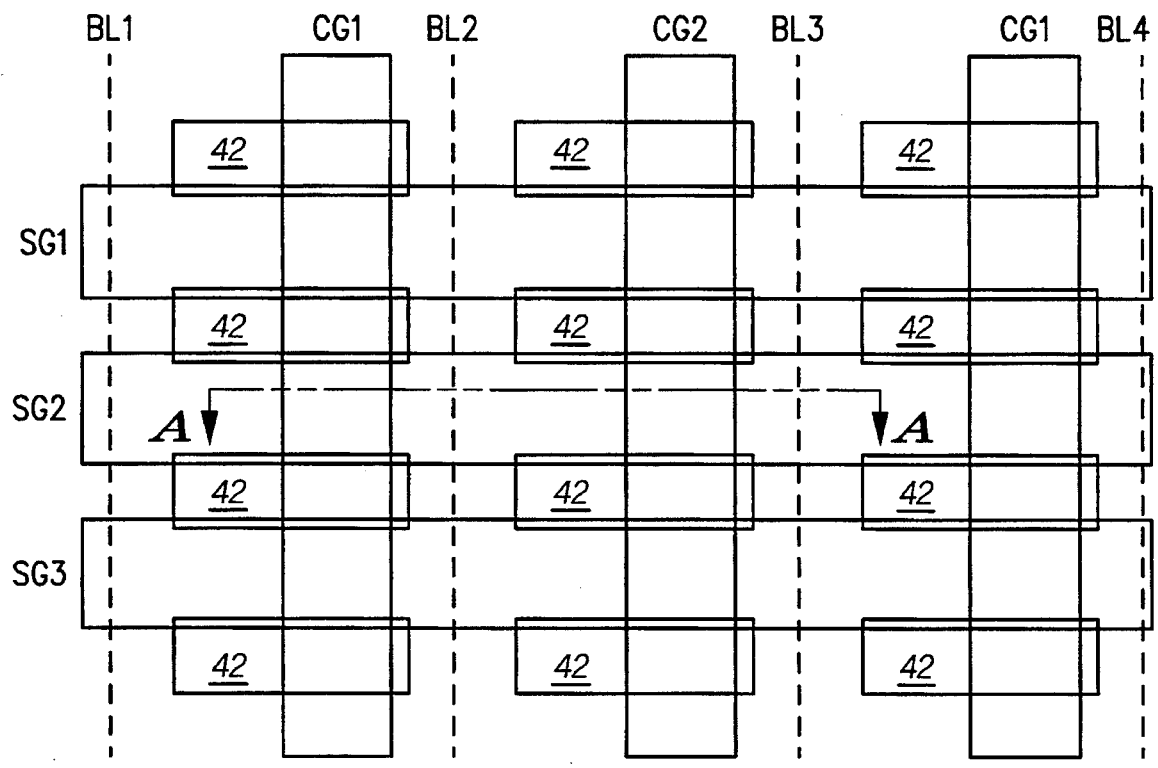
FIG. 8 is a plan view of a memory array arranged in accordance with the invention.

A plan view of the cross-point EEPROM memory array, arranged in accordance with the invention, is illustrated in FIG. 8. A block of nine memory cells are arranged having cross-point, virtual ground architecture. Three control gate lines, designated CG1, CG2, and CG3 are displaced in parallel and define separate columns of the array. Diffused bit-lines, designated BL1, BL2, BL3, and BL4 are formed in the substrate and aligned to the drain-side of the control gate lines. Select gate lines, designated SG1, SG2, and SG3 are disposed in parallel and run perpendicular to the control gate lines, and to the diffused bit-lines. Field isolation regions 42 separate the memory array into separate active regions for each cell. The control gate lines form control gate electrodes at the locations where the control gate lines overlie a first portion of each active region between the field isolation regions. Correspondingly, the select gate lines form select gate electrodes in a second portion of each active region intermediate to the bit-lines.

The cell structure illustrated in FIG. 7 is a cross-sectional representation of a portion of the array shown in FIG. 8, taken along section line A—A. In FIG. 7, control gate 22 corresponds to CG1 and control gate 24 corresponds to CG2. Additionally, source region 32 corresponds to a first bit-line, designated BL2, and drain region 34 corresponds to a second bit-line, designated BL3, and select gate 40 corresponds to a select gate line, designated SG2.

Figure 9:
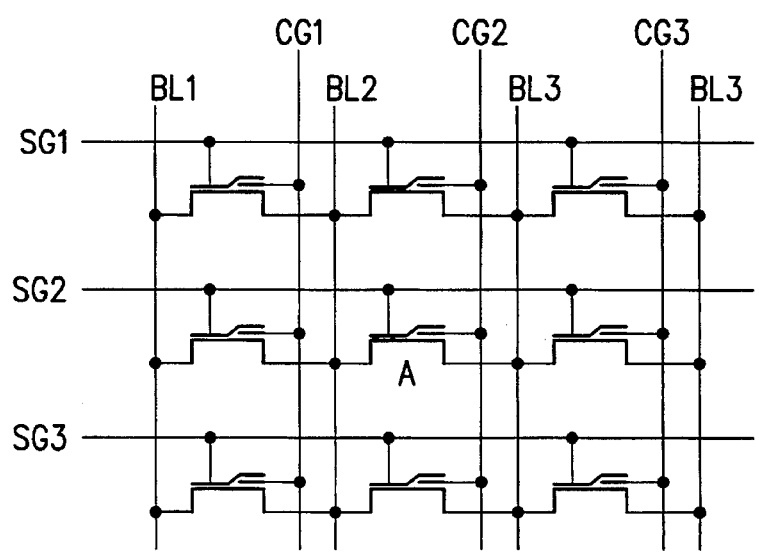
FIG. 9 is a schematic diagram of the memory array illustrated in FIG. 8.

FIG. 9 illustrates a schematic diagram of the cross-point EEPROM memory array of shown in FIG. 8. The operating voltages for a representative cell in the cross-point array, denoted cell A, are given in Table I.

side injection of charge carriers into trapping sites located on the source-side of the control gate electrode, there is no overlap of the stored charge with the drain region. Furthermore, the relatively thick bottom oxide of the ONO layer provides a charge conduction barrier in the absence of significant voltage difference across the oxide layer. Because there is a relatively small voltage difference (about 4 to 5 volts) between the control gate and the drain region during programming, charge is not inadvertently removed from the trapping sites and into the drain region in cells in the same column as cell A.

Cell A is erased by applying 13 volts to CG2 while grounding all other control gates, bit-lines, and select gate-lines. Cell A is erased by tunneling electrons through second silicon dioxide layer 16 of ONO layer 17, and dissipating the electrons in the control gate electrode. It is important to note that the erase operation is enhanced by the high quality of second silicon dioxide layer 16. As previously described, second silicon dioxide layer 16 is deposited by a chemical vapor deposition process, such that the silicon dioxide layer is relatively defect free.

In floating gate type EEPROM devices of the prior art, erasing is performed through a thin tunnel oxide layer between the floating gate and the drain region. Over time, the thin oxide layer is subject to stressing from repeating erase cycles. In severe cases, the thin oxide layer can breakdown resulting in cell failure. However, erasure by top oxide tunneling avoids the stressing conditions on the bottom oxide layer and results in improved durability of the memory cells.

Data is read from cell A by applying 1 to 2 volts to BL3 and Vcc voltage to select gate line SG2. The control gate is brought to a read voltage Vr, which has a value intermediate to the bit-line voltage and Vcc voltage. In the case of a 5-volt power supply Vcc is 5 volts, and Vr preferably has a value of about 2 to 3 volts. Because the select gate lines for memory cells in the same column in cell A are grounded, these cells are not subject to a read disturb condition. Therefore, the bit-line voltage can be independently varied

TABLE I

|  | BL1 | BL2 | BL3 | BL4 | CG1 | CG2 | CG3 | SG1 | SG2 | SG3 |
| --- | --- | --- | --- | --- | --- | --- | --- | --- | --- | --- |
| Program A | 0 | 0 | 5 | 0 | 0 | 9 | 0 | 0 | 1–2 | 0 |
| Erase | 0 | 0 | 0 | 0 | 0 | 13 | 0 | 0 | 0 | 0 |
| Read A | 0 | 0 | 1–2 | 0 | 0 | Vr | 0 | 0 | Vcc | 0 |

During the programming of memory cell A, 5 volts are applied to BL3 and 9 volts are applied to control gate. CG2, while BL2 is grounded. Also a low voltage of about 1 to 2 volts is applied to select gate SG2. All other lines in the array are grounded. The selected memory cell A is programmed under the source-side injection condition as described above. During programming, the select gate is supplied with only 1 to 2 volts, such that the programming current is limited by the select gate transistor. Preferably, the programming current is regulated to about 20 microamps per bit. The low programming current in combination with the 5 volts applied to BL3 enables efficient source-side injection on electrons into ONO layer 17. The cross-point array of the invention can also be operated with a 3-volt supply, or even a 1.8-volt supply, by electrically coupling the supply voltage to charge pump circuitry.

The array of the present invention avoids drain disturb conditions in adjacent memory cells. As a result of sourceto optimize the reading of cell A without subjecting adjacent cells to false programming conditions. Although select gate line SG2 has a positive voltage while reading cell A, control gate electrodes and bit-lines in adjacent cells in the same row as cell A are at ground potential. Accordingly, a read disturb condition cannot develop in memory cells adjacent to and in the same row as cell A.

Thus it is apparent that there has been provided, in accordance with the invention, a cross-point EEPROM memory array which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional substrate doping steps can be carried out to form drain extensions, and graded junctions, and the like.

It is therefore intended to include within the invention all such variations and modifications as fall within the scope of the appended claims and equivalents thereof.

We claim:

1. A cross-point EEPROM memory array having a plurality of memory cells comprising:

a semiconductor substrate partitioned into a plurality of active regions separated by isolation regions;

a plurality of first semiconductor layers disposed on the semiconductor substrate and forming control gate electrodes at each location where a first semiconductor layer overlies each active region;

an ONO layer overlying a first portion of each active region and separating the first semiconductor layers therefrom, wherein the ONO layer contains charge trapping sites, wherein the ONO layer includes, a first silicon dioxide layer having a first thickness, silicon nitride layer overlying the first silicon dioxide layer, and a second silicon dioxide layer overlying the silicon nitride layer and having a second thickness, wherein the first thickness is greater than the second thickness;

a plurality of second semiconductor layers disposed on the substrate perpendicular to the first semiconductor layers, wherein each second semiconductor layer overlies a second portion of each active region and each control gate electrode, and wherein each second semiconductor layer forms a select gate electrode adjacent to each control gate electrode;

a dielectric layer overlying the second portion of each active region and separating the second semiconductor layers therefrom; and a plurality of diffused bit-lines disposed in the substrate parallel to the first semiconductor layers forming a drain region in each active region, wherein every other bit-line acts as a source region and wherein the charge trapping sites are located in each ONO layer adjacent to the source region and each cell in the array is programmed by source-side electron injection into the charge trapping sites.

2. The memory array of claim 1, wherein each memory cell in the array is programmed by applying a positive voltage to each drain region, to each control gate electrode, and to each select gate electrode in each memory cell, and wherein each memory cell is erased by grounding each drain region and applying a positive voltage to each control gate electrode in each memory cell.

3. A cross-point EEPROM memory array comprising:

a semiconductor substrate having a first and second diffused bit-lines therein and spaced apart by a channel region;

a control gate electrode overlying a first portion of the channel region;

a select gate electrode overlying the control gate electrode and a second portion of the channel region, wherein the second portion of the channel region is located between the control gate electrode and the first diffused bitline, and wherein the control gate electrode and the select gate electrode are disposed on the semiconductor substrate in a perpendicular relationship, and wherein the second diffused bit-line resides in the substrate in parallel relationship to the control gate electrode; and an ONTO layer separating the control gate electrode from the first portion of the channel region, wherein the ONO layer includes a relatively thick silicon dioxide layer overlying the substrate and separated from relatively thin silicon dioxide layer by a silicon nitride layer, wherein the first diffused bit-line acts as a source region, wherein the second diffused bit-line acts as a drain region, and wherein the memory array further comprises charge trapping sites in the silicon nitride layer in proximity to the source region, such that charge carriers from the source region are retained in the trapping sites.

4. The memory array of claim 3, wherein the control gate electrode is electrically isolated from the select gate electrode by an insulating layer comprising:

an insulating sidewall spacer overlying an edge surface of the control gate electrode; and an insulating layer overlying an upper surface of the control gate electrode.

5. The memory array of claim 3, wherein the relatively thick silicon dioxide layer has a thickness of 100 to 150 angstroms, and the relatively thin silicon dioxide layer has a thickness of 30 to 40 angstroms.

6. A cross-point EEPROM memory array having a plurality of memory cells comprising:

a semiconductor substrate partitioned into a plurality of active regions separated by isolation regions;

a plurality of control gate electrodes each overlying a first portion of each active region, and the plurality of control gate electrodes further electrically coupled by a plurality of control gate lines disposed on the semiconductor substrate, wherein each control gate electrode is separated from each active region by an ONO layer, and wherein each ONO layer contains charge trapping sites;

a plurality of select gate electrodes, each overlying a second portion of each active region and each control gate electrode and electrically coupled by a select gate line disposed on the semiconductor substrate perpendicular to each control gate line;

a plurality of diffused bit-lines disposed in the semiconductor substrate parallel to each control gate line, wherein each bit-line is aligned to an edge of each control gate electrode, and wherein each memory cell is programmed by transferring charge carriers into the trapping sites in each ONO layer.

7. The memory array of claim 6, wherein each ONO layer comprises:

a first silicon dioxide layer having a first thickness;

a silicon nitride layer overlying the first silicon dioxide layer; and a second silicon dioxide layer overlying the silicon nitride layer and having a second thickness, wherein the first thickness is greater than the second thickness.

8. The memory array of claim 7, wherein the first silicon dioxide layer has a thickness of 100 to 150 angstroms, and the second silicon dioxide layer has a thickness of 30 to 40 angstroms.

9. The memory array of claim 6, wherein each cell in the array is programmed by applying a first positive voltage to a first selected bit-line, a second positive voltage to a selected control gate line, and a third positive voltage to a selected select gate line, and by grounding a second selected bit-line, and wherein each cell is erased by grounding the first and second selected bit-lines and the selected select gate line, and applying a fourth positive voltage to the selected control gate line, wherein the fourth positive voltage is greater than the first, second, and third positive voltages.

* * * * *